US012701663B2

(12) United States Patent
Gokcen et al.

(10) Patent No.: US 12,701,663 B2
(45) Date of Patent: Aug. 4, 2026

(54) PRINTER DEVICE WITH AUTOMATIC PRINTING APPARATUS FOR FLEXIBLE CIRCUIT APPLICATIONS

(71) Applicant: HACETTEPE UNIVERSITESI REKTORLUK, Ankara (TR)

(72) Inventors: Dincer Gokcen, Ankara (TR); Ibrahim Bozyel, Ankara (TR); Mustafa Eryilmaz, Ankara (TR)

(73) Assignee: HACETTEPE UNIVERSITESI REKTORLUK, Ankara (TR)

( * ) Notice: Subject to any disclaimer, the term of this patent is extended or adjusted under 35 U.S.C. 154(b) by 661 days.

(21) Appl. No.: 18/015,830

(22) PCT Filed: Jul. 9, 2021

(86) PCT No.: PCT/TR2021/050710
§ 371 (c)(1),
(2) Date: Jan. 12, 2023

(87) PCT Pub. No.: WO2022/019867
PCT Pub. Date: Jan. 27, 2022

(65) Prior Publication Data
US 2023/0180392 A1    Jun. 8, 2023

(30) Foreign Application Priority Data
Jul. 20, 2020    (TR) ................................. 2020/11480

(51) Int. Cl.
*H05K 3/12*      (2006.01)
*B41J 2/175*    (2006.01)

(52) U.S. Cl.
CPC .............. *H05K 3/125* (2013.01); *B41J 2/175* (2013.01); *H05K 2203/013* (2013.01)

(58) Field of Classification Search
CPC . H05K 2203/013; H05K 3/4664; B41J 2/175; H01L 21/67144
See application file for complete search history.

(56) References Cited

U.S. PATENT DOCUMENTS

| | | | |
|---|---|---|---|
| 5,420,615 A | 5/1995 | Witz et al. | |
| 2012/0186079 A1 | 7/2012 | Ciminelli | |
| 2022/0352411 A1* | 11/2022 | Choi | H10H 20/01 |
| 2022/0396064 A1* | 12/2022 | Kim | B05C 5/0254 |
| 2025/0100280 A1* | 3/2025 | Lee | B41J 2/164 |

FOREIGN PATENT DOCUMENTS

WO      2014133600 A1    9/2014

OTHER PUBLICATIONS

ISR for International Application PCT/TR2021/050710 mailed Dec. 8, 2021.
Written Opinion for International Application PCT/TR2021/050710 mailed Dec. 8, 2021.

* cited by examiner

*Primary Examiner* — Karl Kurple
(74) *Attorney, Agent, or Firm* — LADAS & PARRY LLP

(57)      ABSTRACT
The present invention relates to a device (1) for enabling high-viscosity conductive and dielectric printing fluids, that are used in commercial and experimental flexible circuit manufacturing practices and included at the universal or experimental development stage, to be printed automatically in compliance with the flexible circuit diagram desired to be printed and without using a flexible base material.

22 Claims, 2 Drawing Sheets

40

41

44

42

45

43

46

47

PRINTER DEVICE WITH AUTOMATIC PRINTING APPARATUS FOR FLEXIBLE CIRCUIT APPLICATIONS

CROSS REFERENCE TO RELATED APPLICATIONS

This application is a U.S. National Stage Application under 35 U.S.C. § 371 of International Application No. PCT/TR2021/050710 which was filed on 9 Jul. 2021, which claims priority from Turkish Application No. 2020/11480 filed 20 Jul. 2020 the disclosures of which are incorporated in their entirety by reference herein.

TECHNICAL FIELD

The present invention relates to a device for enabling high-viscosity conductive and dielectric printing fluids, that are used in commercial and experimental flexible circuit manufacturing practices and included at universal or experimental development stage, to be printed automatically in compliance with the flexible circuit diagram desired to be printed and without using a flexible base material.

BACKGROUND OF THE INVENTION

Today, the prevalence of flexible circuits prepared by being printed onto flexible materials by means of conductive inks and used in fields such as biomedical and telecommunication, under the title of electronic, increase. Although a plurality of conductive and dielectric printing fluids have been developed up until now, research-development processes of different conductive and dielectric printing fluids still continue so as to be used for printing flexible circuits with different purposes.

It is required to print pre-developed conductive printing fluids onto a predetermined flexible base material in flexible circuit printing applications and then reshape the flexible base material according to the area wherein the flexible circuit will be applied. New printing fluids, which are currently being developed and have a higher viscosity than current conductive and dielectric printing fluids, can eliminate the need of predetermining any flexible base material and applying reshaping to the flexible base material.

Although a plurality of printing methods enabling the use of pre-developed conductive printing fluids in flexible circuit printing applications are available, there is no device suitable for direct application of new printing fluids which are currently being developed and have a higher viscosity than current conductive and dielectric printing fluids. Therefore, it is not possible to print new printing fluids being at the development stage such that they will create complex circuit shapes.

Considering deficiencies of printing devices with conductive and dielectric printing fluid in the current technique, it is understood that there is a need for a device for enabling high-viscosity conductive and dielectric printing fluids, that are used in commercial and experimental flexible circuit manufacturing practices and included at the universal or experimental development stage, to be printed automatically in compliance with the flexible circuit diagram desired to be printed and without using a flexible base material in the state of the art.

The United States patent document no. U.S. Pat. No. 5,172,995, an application in the state of the art, discloses a stylo pen system with coaxial reservoir used in technical drawing systems. The said system comprises an ink reservoir which is coaxially positioned inside the stylo pen, a printing tip, a printing needle, a weighted piston, and a compression spring.

SUMMARY OF THE INVENTION

An objective of the present invention is to realize a device for enabling high-viscosity conductive and dielectric printing fluids, that are used in commercial and experimental flexible circuit manufacturing practices and included at the universal or experimental development stage, to be printed automatically in compliance with the flexible circuit diagram desired to be printed and without using a flexible base material.

DETAILED DESCRIPTION OF THE INVENTION

"A Printer Device with Automatic Printing Apparatus for Flexible Circuit Applications" realized to fulfill the objective of the present invention is shown in the figures attached, in which.

Figure 1:
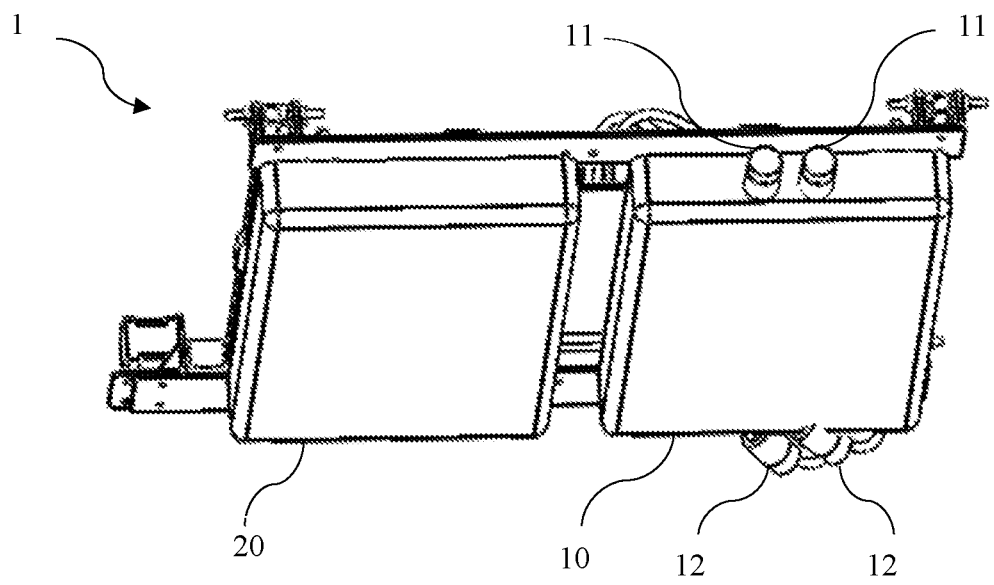
FIG. 1 is a perspective view of the bottom of the frame in the inventive device.
Figure 2:
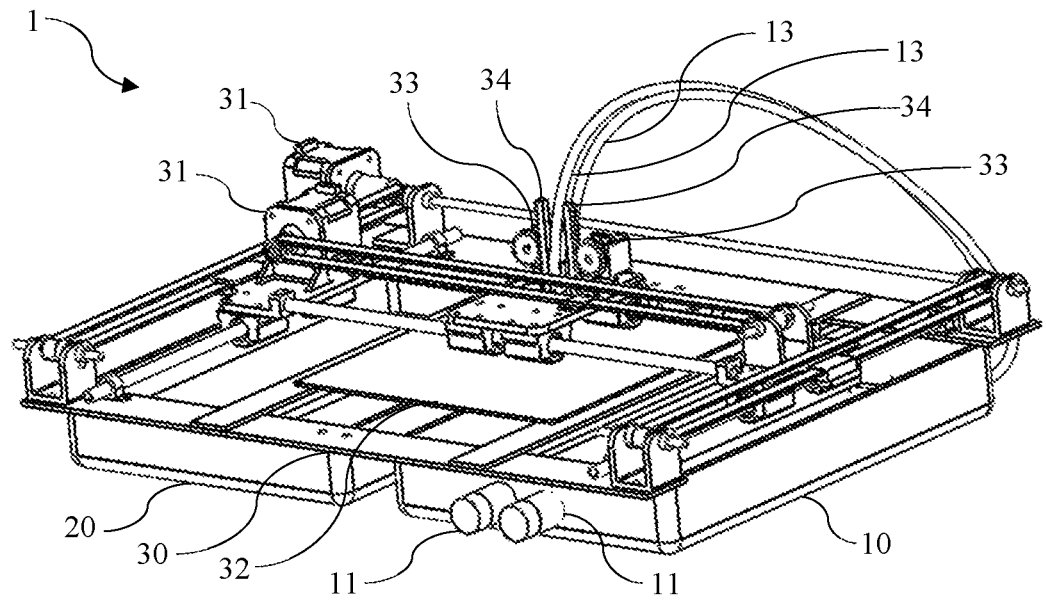
FIG. 2 is a perspective view of the top of the frame in the inventive device.
Figure 3:
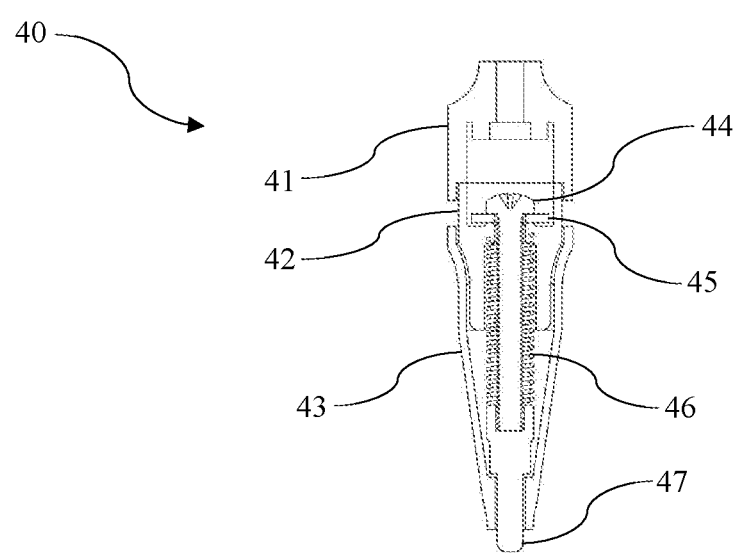
FIG. 3 is a sectional view of the printing member included in the inventive device.

The components illustrated in the figures are individually numbered, where the numbers refer to the following:

1. Device
10. Fluid chamber
11. Mixer motor
12. Flow motor
13. Flow pipe
20. Electronic control unit
30. Frame
31. Horizontal motion motor
32. Heated table with pressure sensor
33. Pressure motor
34. Vertical motion member
40. Printing member
41. Flow head
42. Connecting pipe
43. Printer head
44. Valve
45. Tie rod
46. Pressure spring
47. Printing tip The inventive device (1) for enabling high-viscosity conductive and dielectric printing fluids, that are used in commercial and experimental flexible circuit manufacturing practices and included at universal or experimental development stage, to be printed automatically in compliance with the flexible circuit diagram desired to be printed and without using a flexible base material comprises:

at least one fluid chamber (10) which is configured to store; to mix a plurality of conductive and dielectric printing fluids at the same time independently of each other; to pump and to carry these during printing;

at least one electronic control unit (20) which is configured to receive the file comprising the flexible circuit diagram to be printed and the printing rules; to control electrical and electromechanical members in order to enable printing according to the viscosity, heating and shape information within the file; and to enable the user to control the print instantly by means of input/output members;

a frame (30) which is configured to basically contain the fluid chamber (10) and the electronic control unit (20) on itself, a plurality of horizontal motion motors (31) which are located on the frame (30) and configured to apply the primary and secondary horizontal axis movements in the flexible circuit diagram;

at least one heated table with pressure sensor (32) which is located on the frame (30) and configured to carry at least one pressure sensor controlling the pressure that is applied during printing of the flexible circuit and to carry a heater enabling to heat the flexible circuit;

at least one pressure motor (33) which is driven by the horizontal motion motors (31) and configured to manage the pressure necessary in a printing transaction;

at least one vertical motion member (34) which is actuated by a pressure motor (33) and configured to create pressure by the vertical movement in a printing transaction;

at least one printing member (40) which is positioned based on the vertical motion member (34) and configured to transfer the conductive or dielectric printing fluid incoming from the fluid chamber (10) during printing of the flexible circuit to the printing surface in a controlled way; and comprises:

a flow head (41) which is located inside the printing member (40); configured to receive the conductive or dielectric printing fluid incoming from the fluid chamber (10) and to transfer it when pressure is applied;

a connecting pipe (42) which is located inside the printing member (40); configured to receive and transfer the conductive or dielectric printing fluid incoming from the flow head (41);

a printer head (43) which is located inside the printing member (40); configured to receive the conductive or dielectric printing fluid incoming from the connecting pipe (42) and to transfer it when pressure is applied;

a valve (44) which is located inside the printing member (40); configured to be in contact with the flow head (41) and to allow transmission of the conductive or dielectric printing fluid by cutting off its contact with the flow head (41) when pressure is applied;

a tie rod (45) which is located inside the printing member (40); positioned based on the valve (44); passes through the connecting pipe (42) concentrically and is configured to transmit the applied pressure to the valve (44);

a pressure spring (46) which is located inside the printing member (40); positioned inside the connecting pipe (42) and the printer head (43), outside the tie rod (45) and concentrically to the tie rod (45); configured to enable the valve (44) to contact the flow head (41) by means of the tie rod (45) when pressure is not applied and to stop transmission of the conductive or dielectric printing fluid; and a printing tip (47) which is located inside the printing member (40); positioned based on the tie rod (45); passes through the printer head (43) concentrically and contacts the printer head (43); is configured to transmit the pressure to the tie rod (45) by contacting the surface when pressure is applied to the printing surface, to enable transmission of the conductive or dielectric printing fluid to the printing surface by cutting off its contact with the printer head (43), to stop transmission of the conductive or dielectric printing fluid to the printing surface by contacting the printer head (43) again by means of the pressure spring (46) when no pressure is applied.

The fluid chamber (10) included on the inventive device (1) is configured to store; to mix a plurality of conductive and dielectric printing fluids at the same time independently of each other; to pump and to carry these during printing. In a preferred embodiment of the invention, the fluid chamber (10) is configured to store two different printing fluids—one of which has a conductive characteristic and the other one has a dielectric characteristic—and to keep the said fluids in a homogeneous and ready-to-print way by mixing in volumes whereby they are stored with two separate mixer motors (11) connected to the fluid chamber (10), to pump these with two separate flow motors (12) independently and to carry two different printing fluids—one of which has a conductive characteristic and the other one has a dielectric characteristic—by receiving these from two separate flow motors (12) by two separate flow pipes (13).

The electronic control unit (20) included on the inventive device (1) is configured to receive the file comprising the flexible circuit diagram to be printed and the printing rules; to control electrical and electromechanical members such as the flow motors (12), the horizontal motion motors (31), the heated table with pressure sensor (32), at least one pressure motor (33) in order to enable printing according to the viscosity, heating and shape information within the file; and to enable the user to control the print instantly by means of input/output members such as internal or external display.

The frame (30) included on the inventive device (1) is configured to keep mechanical and electromechanical members comprising the fluid chamber (10), the electronic control unit (20) and the horizontal motion motors (31), the heated table with pressure sensor (32), at least one pressure motor (33) and at least one vertical motion member (34), in suitable positions.

The horizontal motion motors (31) included on the inventive device (1) are positioned based on the frame (30) and configured to apply the primary and secondary horizontal axis movements in the flexible circuit diagram. In a preferred embodiment of the invention, two horizontal motion motors (31) are configured to apply movements in the x-axis and y-axis from Cartesian coordinates.

The heated table with the pressure sensor (32) included on the inventive device (1) is positioned based on the frame (30); configured to carry pressure sensors controlling the pressure that is applied during printing of the flexible circuit and to carry a heater enabling to heat the flexible circuit. In a preferred embodiment of the invention, the heated table with pressure sensor (32) is shaped like a rectangle; it is continuously followed up by the electronic control unit (20) whether the pressure applied during printing by means of four pressure sensors included in the corners of the heated table with the pressure sensor (32) and it is continuously followed up by the electronic control unit (20) whether the heat treatment that is desired to be applied to the flexible circuit during the printing by the heater within the heated table with the pressure sensor (32), is applied correctly. Thereby, conductive and dielectric printing fluids are enabled to create flexible dielectric circuit base and flexible conductive connection pathways without using a flexible base material.

The pressure motor (33) included on the inventive device (1) is positioned based on the horizontal motion motors (31) and configured to manage the pressure necessary in a printing transaction. In a preferred embodiment of the invention, two separate pressure motors (33) are configured to manage the pressure necessary in a printing transaction of two different printing fluids—one of which has a conductive characteristic and the other one has a dielectric characteristic—at the same time.

The vertical motion member (34) included on the inventive device (1) is positioned based on a pressure motor (33) and configured to create pressure by the vertical movement in a printing transaction. In a preferred embodiment of the invention, two separate vertical motion members (34) are configured to enable the printing member (40) to contact the printing surface and to interrupt the contact by connecting to two separate pressure motors (33) and converting the precision rotary motion created by the pressure motors (33) into vertical motion.

The printing member (40) included on the inventive device (1) is positioned based on the vertical motion member (34) and configured to transfer the conductive or dielectric printing fluid to the printing surface in a controlled way during printing of the flexible circuit. In a preferred embodiment of the invention, two separate printing members (40) are configured to be positioned based on two separate vertical motion members (34) and concentrically with the normal direction of the heated table with the pressure sensor (32) and to transfer two different printing fluids—one of which has a conductive characteristic and the other one has a dielectric characteristic—to the printing surface in a controlled way.

The flow head (41) located inside each printing member (40) on the inventive device (1) is configured to receive the conductive or dielectric printing fluid incoming from the fluid chamber (10) and to transfer it to the connecting pipe (42) when pressure is applied. In a preferred embodiment of the invention, the flow head (41) is configured to act as a first flow control chamber providing flow continuity of the conductive or dielectric printing fluid.

The connecting pipe (42) located inside each printing member (40) on the inventive device (1) is configured to receive the conductive or dielectric printing fluid incoming from the flow head (41) and to transfer it to the printer head (43).

The printer head (43) located inside each printing member (40) on the inventive device (1) is configured to receive the conductive or dielectric printing fluid incoming from the connecting pipe (42) and to transfer it to the printing surface when pressure is applied. In a preferred embodiment of the invention, the printer head (43) is configured to act as a second flow control chamber providing flow continuity of the conductive or dielectric printing fluid.

The valve (44) located inside each printing member (40) on the inventive device (1) is configured to be in contact with the flow head (41) and to allow transmission of the conductive or dielectric printing fluid by cutting off its contact with the flow head (41) when pressure is applied. In a preferred embodiment of the invention, the valve (44) contacts the flow head (41) in a sealed way when no pressure is applied, and upon the pressure applied to the printing surface by the printing tip (47) is transferred by the tie rod (45), it is configured to allow transmission of the conductive or dielectric printing fluid from the first flow control chamber to the second flow control chamber in the direction of the connecting pipe (42) by cutting off its sealed contact with the flow head (41).

The tie rod (45) located inside each printing member (40) on the inventive device (1) is positioned based on the valve (44) and the printing tip (47); passes through the connecting pipe (42) concentrically and it is configured to transmit the pressure, that is applied to the printing surface by the printing tip (47), to the valve (44).

The pressure spring (46) located inside each printing member (40) on the inventive device (1) is positioned inside the connecting pipe (42) and the printer head (43), outside the tie rod (45), and concentrically to the tie rod (45); configured to enable the valve (44) to contact the flow head (41) by means of the tie rod (45) when no pressure is applied and to stop transmission of the conductive or dielectric printing fluid. In a preferred embodiment of the invention, the pressure spring (46) is configured to provide sealed contact of the valve (44) to the flow head (41) again when the contact of the printing tip (47) with the printing surface is interrupted and to control the execution of the flexible circuit printing precisely.

The printing tip (47) located inside each printing member (40) on the inventive device (1) is positioned based on the tie rod (45); passes through the printer head (43) concentrically and contacts the printer head (43) in a sealed way; is configured to transmit the pressure to the tie rod (45) by contacting the printing surface when pressure is applied to the printing surface, to enable transmission of the conductive or dielectric printing fluid from the second flow control chamber to the printing surface by cutting off its contact with the printer head (43), to stop transmission of the conductive or dielectric printing fluid to the printing surface by contacting the printer head (43) again by means of the pressure spring (46) by cutting off its contact with the printing surface when no pressure is applied.

In the inventive device (1), the file comprising the flexible circuit diagram to be printed and the printing rules is transmitted to the electronic control unit (20) from external electronic devices; the pressure to be applied by at least one pressure motor (33) is determined according to the viscosity information included in the file; the applied pressure is followed up by the pressure sensors within the heated table with pressure sensor (32) and the flow rate of the conductive or dielectric printing fluid to be pumped by at least one flow motor (12) is determined; it is ensured to keep the flexible circuit area at a temperature by the heater within the heated table with pressure sensor (32) according to the heating information included in file and two different printing fluids—one of which has a conductive characteristic and the other one has a dielectric characteristic—are enabled to create the flexible dielectric circuit base and the flexible conductive connection pathways; the horizontal motion motors (31) are enabled to take at least one printing member (40) to a desired position according to the shape information included in the file and the user is enabled to control the print instantly by means of input/output members such as internal or external display. The first flow control chamber and the second flow control chamber created by the flow head (41), the connecting pipe (42) and the printer head (43) within the printing member (40) enable to stabilize the flow rate of the conductive or dielectric printing fluid by the pressure that is stabilized during printing; the printing control mechanism consisting of the valve (44), the tie rod (45), the pressure spring (46) and the printing tip (47) enables to transfer the transmission of the conductive or dielectric printing fluid having a stabilized flow rate to the printing surface such that it will create a desired flexible dielectric circuit base and flexible conductive connection pathways when the print controlling mechanism applies pressure to the printing surface, and to precisely terminate the drawing at interrupted drawing positions in the flexible circuit diagram by interrupting the transmission of the conductive or dielectric printing fluid by sealed contact in two different points when the pressure being applied to the printing surface is removed. At least one flow motor (12) within the fluid chamber (10) enables to pump of the conductive or dielectric printing fluid with a stabilized flow rate in control of the electronic control unit (20) and to stop the pumping when the printing transaction is finished.

Within these basic concepts; it is possible to develop various embodiments of the inventive "Printer Device with Automatic Printing Apparatus for Flexible Circuit Applications (1)"; the invention cannot be limited to examples disclosed herein and it is essentially according to claims.

The invention claimed is:

1. A device (1) for enabling high-viscosity conductive and dielectric printing fluids, to be printed with commercial and experimental flexible circuit manufacturing practices at the universal or experimental development stage, automatically in compliance with a flexible circuit diagram and without using a flexible base material; characterized by:

at least one fluid chamber (10) which is configured to store; to mix a plurality of conductive and dielectric printing fluids at the same time independently of each other; to pump and to carry the plurality of conductive and dielectric printing during a printing operation;

at least one electronic control unit (20) which is configured to receive a file comprising the flexible circuit diagram to be printed and the printing rules; to control electrical and electromechanical members in order to enable the printing operation according to viscosity, heating, and shape information within the file; and to enable a user to control the printing operation instantly by input/output members;

a frame (30) which is configured to contain the fluid chamber (10) and the electronic control unit (20);

a plurality of horizontal motion motors (31) which are located on the frame (30) and configured to apply primary and secondary horizontal axis movements in the flexible circuit diagram;

at least one heated table with a pressure sensor (32) which is located on the frame (30) and said at least one heated table configured to carry at least one pressure sensor controlling a pressure that is applied during the printing operation of a flexible circuit and to carry a heater to heat the flexible circuit;

at least one pressure motor (33) which is driven by the horizontal motion motors (31) and configured to manage the pressure necessary in the printing operation;

at least one vertical motion member (34) which is actuated by a pressure motor (33) and configured to create a pressure by a vertical movement in the printing operation;

at least one printing member (40) which is positioned based on the vertical motion member (34) and configured to transfer the conductive or dielectric printing fluid incoming from the fluid chamber (10) during the printing of the flexible circuit to the printing surface in a controlled way; and comprises:

a flow head (41) which is located inside the printing member (40); configured to receive the conductive or dielectric printing fluid incoming from the fluid chamber (10) and to transfer the conductive or dielectric printing fluid when the pressure is applied;

a connecting pipe (42) which is located inside the printing member (40); configured to receive and transfer the conductive or dielectric printing fluid incoming from the flow head (41);

a printer head (43) which is located inside the printing member (40); configured to receive the conductive or dielectric printing fluid incoming from the connecting pipe (42) and to transfer the conductive printing fluid or the dielectric printing fluid when the pressure is applied;

a valve (44) which is located inside the printing member (40); said valve configured to be in contact with the flow head (41) in a sealed way and to allow transmission of the conductive or dielectric printing fluid by cutting off contact in the sealed way of the valve with the flow head (41) when the pressure is applied to the printing surface by the printing tip (47) to the valve (44);

a tie rod (45) which is located inside the printing member (40); positioned based on the valve (44); passes through the connecting pipe (42) concentrically and is configured to transmit the applied pressure to the valve (44);

the pressure, that is applied to the printing surface by the printing tip (47), to the valve (44);

a pressure spring (46) which is located inside the printing member (40); positioned inside the connecting pipe (42) and the printer head (43), outside the tie rod (45), and concentrically to the tie rod (45); configured to enable the valve (44) to contact the flow head (41) by the tie rod (45) when pressure is not applied to stop transmission of the conductive or dielectric printing fluid; and a printing tip (47) which is located inside the printing member (40); positioned based on the tie rod (45); passes through the printer head (43) concentrically and contacts the printer head (43) in a sealed way; said printing tip is configured to transmit the pressure to the tie rod (45) by contacting the printing surface when the pressure is applied to the printing surface, to enable transmission of the conductive or dielectric printing fluid to the printing surface by cutting off the sealed way contact of the printing tip (47) with the printer head (43), to stop transmission of the conductive or dielectric printing fluid to the printing surface by contacting the printer head (43) again by the pressure spring (46) when no pressure is applied.

2. A device (1) according to claim 1; characterized by the fluid chamber (10) which is configured to store; to mix the plurality of conductive and dielectric printing fluids at the same time independently of each other; to pump and to carry the plurality of conductive and dielectric printing fluids during the printing operation.

3. A device (1) according to claim 1; characterized by the fluid chamber (10) which is configured to store two different printing fluids—one of which has a conductive characteristic and the other one has a dielectric characteristic—and to keep each of the fluids homogeneous by mixing whereby the two different printing fluids are stored with two separate mixer motors (11) connected to the fluid chamber, to pump the two different printing fluids with two separate flow motors (12) connected to the fluid chamber independently and to carry the two different printing fluids—by receiving the two different printing fluids from two separate flow motors (12) connected to the fluid chamber.

4. A device (1) according to claim 1; characterized by the electronic control unit (20) which is configured to receive the file comprising the flexible circuit diagram to be printed and the printing rules; to control electrical and electromechanical members including the flow motors (12), the horizontal motion motors (31), the heated table with pressure sensor (32), at least one pressure motor (33) in order to enable the printing operation according to the viscosity, heating and shape information within the file; and to enable the user to control the printing operation instantly by the input/output members including an internal or an external display.

5. A device (1) according to claim 1; characterized by the frame (30) which is configured to keep mechanical and electromechanical members comprising the fluid chamber (10), the electronic control unit (20), and the horizontal motion motors (31), the heated table with pressure sensor (32), at least one pressure motor (33) and at least one vertical motion member (34), in position.

6. A device (1) according to claim 1; characterized by the horizontal motion motors (31) which are positioned based on the frame (30) and configured to apply the primary and secondary horizontal axis movements in the flexible circuit diagram.

7. A device (1) according to claim 6; characterized by horizontal motion motors (31) which are configured to apply the primary and secondary horizontal axis movements in the x-axis and y-axis from Cartesian coordinates.

8. A device (1) according to claim 1; characterized by the heated table with the pressure sensor (32) which is positioned based on the frame (30); configured to carry the pressure sensors controlling the pressure that is applied during the printing of the flexible circuit and to carry the heater enabled to heat the flexible circuit.

9. A device (1) according to claim 8; characterized in that the heated table with the pressure sensor (32) which is shaped like a rectangle; is configured to ensure that the pressure applied during printing is continuously monitored by the electronic control unit through four pressure sensors included in the corners of the heated table and the heat treatment that is desired to be applied to the flexible circuit during the printing by the heater is continuously monitored by the electronic control unit.

10. A device (1) according to claim 1; characterized by the pressure motor (33) which is positioned based on the horizontal motion motors (31) and configured to manage the pressure necessary in the printing operation.

11. A device (1) according to claim 10; characterized by two separate pressure motors (33) which are configured to manage the pressure necessary in a printing operation of two different printing fluids, one of which has a conductive characteristic and the other one has a dielectric characteristic, at a same time.

12. A device (1) according to claim 1; characterized by the vertical motion member (34) which is positioned based on a pressure motor (33) and configured to create the pressure by the vertical movement in the printing operation.

13. A device (1) according to claim 12; characterized by two separate vertical motion members (34) which are configured to enable the printing member (40) to contact the printing surface and to interrupt the contact by connecting to two separate pressure motors (33) and converting a precision rotary motion created by the pressure motors (33) into the vertical motion.

14. A device (1) according to claim 1; characterized by the printing member (40) which is positioned based on the vertical motion member (34) and configured to transfer the conductive or dielectric printing fluid to the printing surface in the controlled way during the printing of the flexible circuit.

15. A device (1) according to claim 14; characterized by two separate printing members (40) which are configured to be positioned based on two separate vertical motion members (34) and concentrically with a normal direction of the heated table with the pressure sensor (32); and to transfer two different printing fluids one of which has a conductive characteristic and the other one has a dielectric characteristic to the printing surface in the controlled way.

16. A device (1) according to claim 14; characterized by the flow head (41) which is located inside each printing member (40), configured to receive the conductive or dielectric printing fluid incoming from the fluid chamber (10) and to transfer the conductive or dielectric printing fluid to the connecting pipe (42) when the pressure is applied.

17. A device (1) according to claim 14; characterized by the flow head (41) which is configured to act as a first flow control chamber providing a flow continuity of the conductive or dielectric printing fluid.

18. A device (1) according to claim 14; characterized by the connecting pipe (42) which is located inside each printing member (40) and configured to receive the conductive or dielectric printing fluid incoming from the flow head (41) and to transfer it the conductive or dielectric printing fluid to the printer head (43).

19. A device (1) according to claim 14; characterized by the printer head (43) which is configured to act as a second flow control chamber providing flow continuity of the conductive or dielectric printing fluid.

20. A device (1) according to claim 14; characterized by the valve (44) which is configured to contact the flow head (41) in a sealed way when no pressure is applied and upon the pressure being applied to the printing surface by the printing tip (47) and transferred by the tie rod (45), cuts sealed contact of the valve with the flow head (41) to allow transmission of the conductive or dielectric printing fluid from the first flow control chamber to the second flow control chamber in the direction of the connecting pipe (42).

21. A device (1) according to claim 14; characterized by the tie rod (45) which is located inside each printing member (40); positioned based on the valve (44) and the printing tip (47); said tie rod passes through the connecting pipe (42) concentrically, and is configured to transmit the pressure, that is applied to the printing surface by the printing tip (47), to the valve (44).

22. A device (1) according to claim 14; characterized by the pressure spring (46) which is configured to provide sealed contact of the valve (44) to the flow head (41) again when the contact of the printing tip (47) with the printing surface is interrupted and to control an execution of the flexible circuit printing precisely.

\* \* \* \* \*